United States Patent [19]

Marshall et al.

[11] Patent Number: 6,061,378
[45] Date of Patent: May 9, 2000

[54] MULTIPLE RESONANT CAVITY SOLID-STATE LASER

[75] Inventors: Dana A. Marshall, Frontenac; Theodore S. McMinn, St. Peters, both of Mo.

[73] Assignee: Cutting Edge Optronics, Inc., St. Louis, Mo.

[21] Appl. No.: 08/855,200

[22] Filed: May 13, 1997

[51] Int. Cl.[7] ............................. H01S 3/091; H01S 3/094
[52] U.S. Cl. ................................................................. 372/75
[58] Field of Search ....................................... 372/75, 97

[56] References Cited

U.S. PATENT DOCUMENTS

| | | | |
|---|---|---|---|
| 3,339,151 | 8/1967 | Smith | 331/94.5 |
| 4,831,629 | 5/1989 | Paoli et al. | 372/50 |
| 4,847,848 | 7/1989 | Inoue et al. | 372/50 |
| 4,894,839 | 1/1990 | Baer | 372/93 |
| 4,901,330 | 2/1990 | Wolfram et al. | 372/75 |
| 4,924,474 | 5/1990 | Yagi et al. | 372/75 |
| 4,942,586 | 7/1990 | Lai | 372/75 |
| 4,975,923 | 12/1990 | Buus et al. | 372/50 |
| 5,022,042 | 6/1991 | Bradley | 372/75 |
| 5,123,025 | 6/1992 | Papuchon et al. | 372/72 |
| 5,216,263 | 6/1993 | Paoli | 372/50 X |
| 5,243,619 | 9/1993 | Albers et al. | 372/97 |
| 5,287,375 | 2/1994 | Fujimoto | 372/38 |
| 5,311,528 | 5/1994 | Fujino | 372/75 |
| 5,323,411 | 6/1994 | Shirasaka et al. | 372/43 |
| 5,337,325 | 8/1994 | Hwang | 372/36 |
| 5,351,259 | 9/1994 | Ishimori et al. | 372/75 |
| 5,394,427 | 2/1995 | McMinn et al. | 372/70 |
| 5,402,437 | 3/1995 | Mooradian | 372/92 |
| 5,463,649 | 10/1995 | Ashby et al. | 372/75 |
| 5,526,373 | 6/1996 | Karpinski | 372/101 |
| 5,533,163 | 7/1996 | Muendel | 385/126 |
| 5,663,979 | 9/1997 | Marshall | 372/103 |

FOREIGN PATENT DOCUMENTS

| | | | |
|---|---|---|---|
| 432 009 A1 | 6/1991 | European Pat. Off. | 3/109 |
| 486 175 A2 | 5/1992 | European Pat. Off. | 3/42 |
| 2 215 906 | 9/1989 | United Kingdom | 3/9 |
| 2 241 109 | 8/1991 | United Kingdom | . |
| WO 90/13158 | 11/1990 | WIPO | 3/7 |
| WO 91/05382 | 4/1991 | WIPO | 3/8 |

OTHER PUBLICATIONS

Ishimori et al., "Pumping Configuration Without Focusing Lenses for a Small Sized Diode–Pumped Nd:YAG Slab Laser," Opt. Let., vol. 17, No., Jan. 1, 1992, pp. 40–42.

C.D. Nabors et al., "High–Power Nd: YAG Microchip Laser Arrays," Technical Digest of Advanced Solid–State Lasers Topical Meeting, TuC5–1, 1992, pp. 189–191, No Month.

*Primary Examiner*—Rodney Bovernick
*Assistant Examiner*—Robert E. Wise
*Attorney, Agent, or Firm*—Jenkens & Gilchrist

[57] ABSTRACT

A multi-cavity, solid-state laser system for producing a plurality of output laser beams includes a plurality of optical energy sources, a solid-state laser medium, and resonating means associated with each of said plurality of optical energy sources. The plurality of optical energy sources produces input optical energy and each is spaced from an adjacent one of the plurality of optical energy sources by a predetermined distance. The input optical energy is produced substantially along a line and is received by the solid-state laser medium. The laser medium has first and second side surfaces that substantially oppose each other and first and second end surfaces that also substantially oppose each other. The input optical energy enters the laser medium through its first side surface and it is substantially absorbed in the laser medium so as to produce a high-gain region associated with each of the plurality of optical energy sources. The resonating means associated with each of the plurality of optical energy sources produces laser resonation through the laser medium and includes a pair of opposing reflective surfaces positioned with the laser medium therebetween. Each of the resonating means is substantially aligned with the line of the associated one of the plurality of optical energy sources and produces one of the plurality of output laser beams.

57 Claims, 4 Drawing Sheets

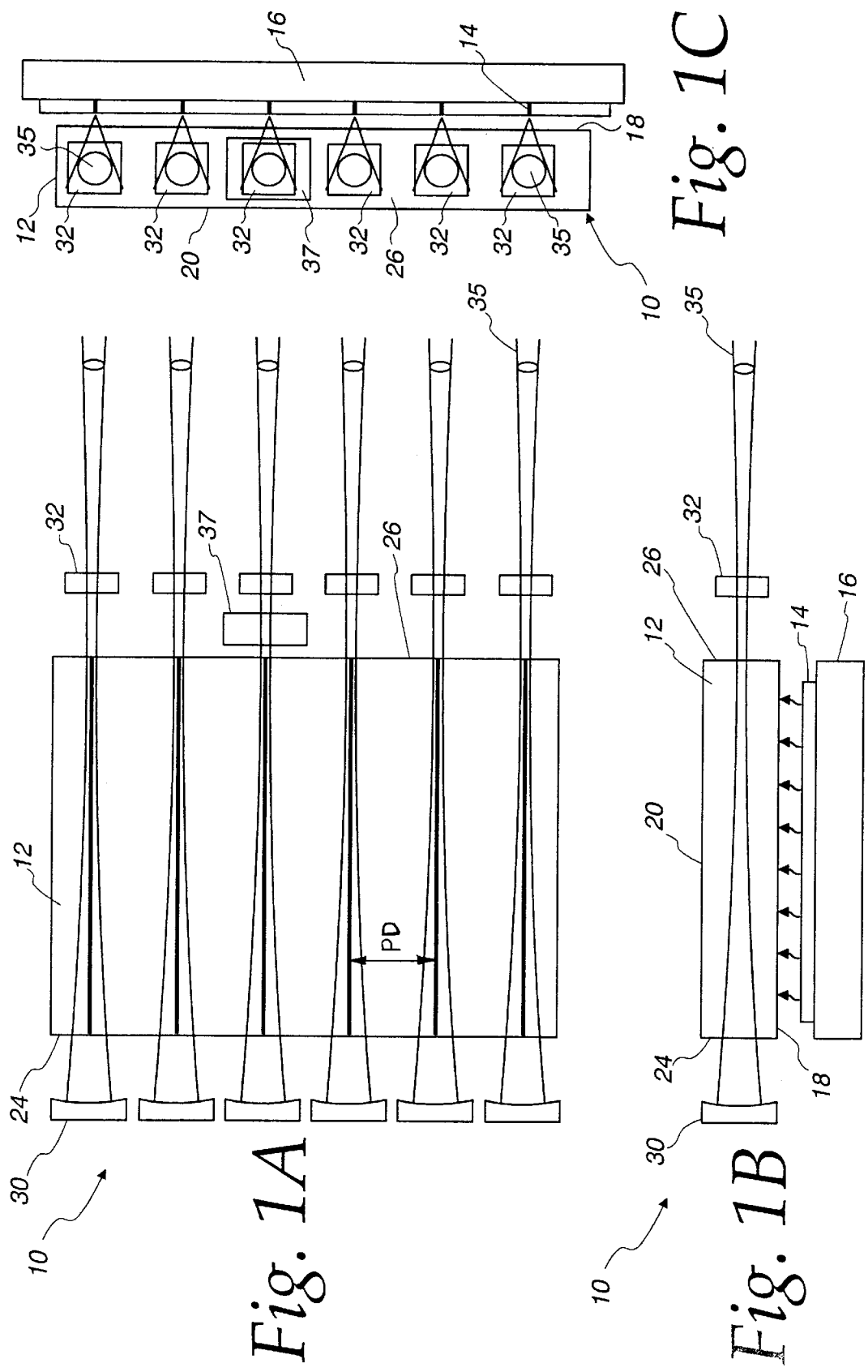

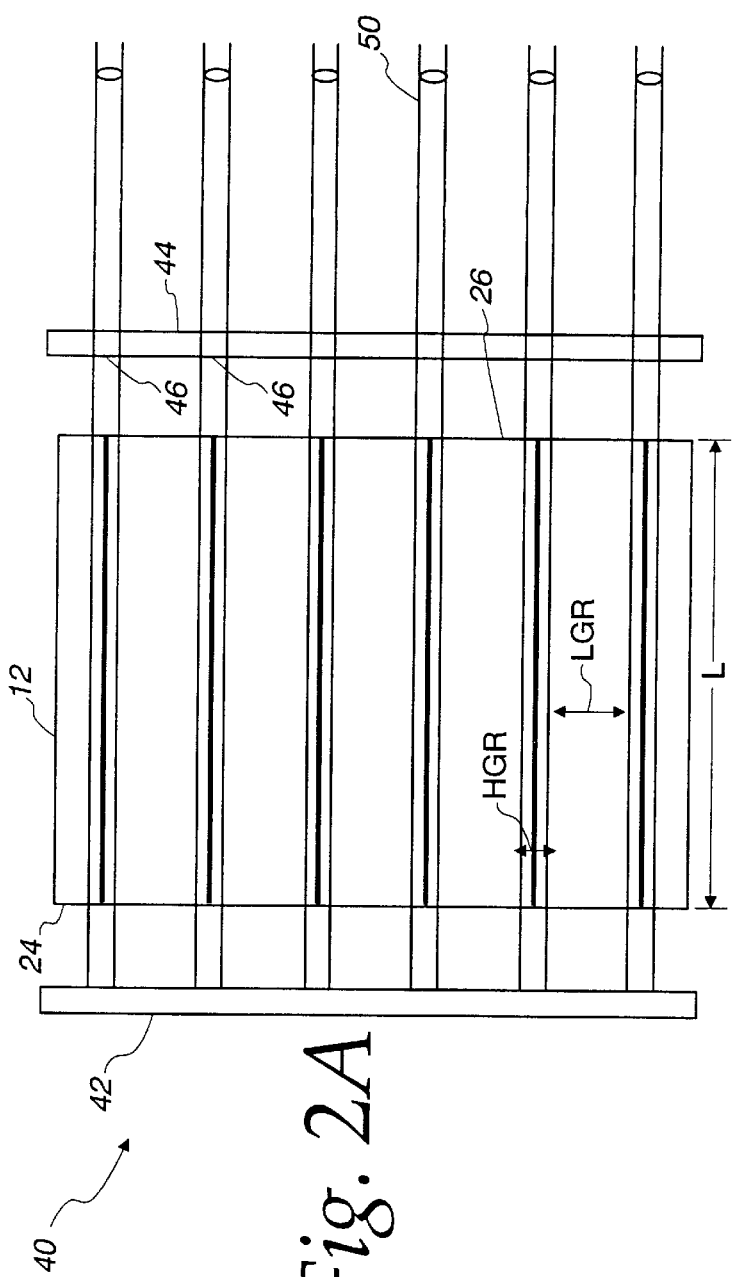
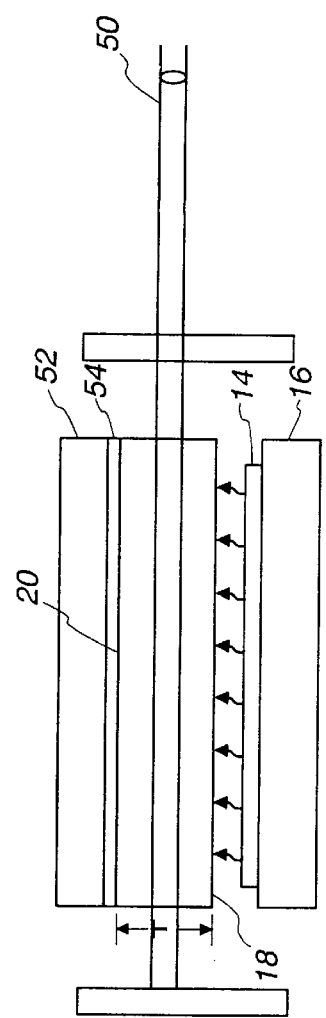
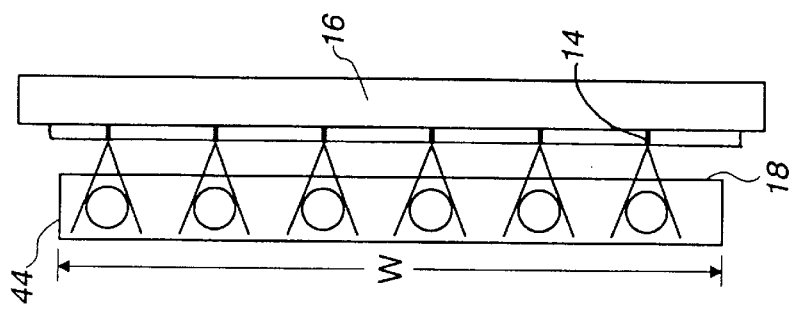

MULTIPLE RESONANT CAVITY SOLID-STATE LASER

FIELD OF THE INVENTION

The present invention relates generally to a solid-state laser system and, in particular, to a solid-state laser having a unitary laser gain element with multiple resonant laser cavities therein.

BACKGROUND OF THE INVENTION

Solid-state laser systems are characterized in that they have a solid-state laser gain medium which converts energy from a pump source to a coherent output laser beam. The pump source can be one of many available energy-producing systems such as flash lamps or semiconductor laser diodes. The energy produced by the pump source is incident upon the laser medium and absorbed thereby.

The absorbed energy in the laser medium causes the atoms in the laser medium to be excited and placed in a higher energy state. Once at this higher state, the laser medium releases its own energy which is placed into an oscillating state by the use of a laser resonator. The laser resonator includes at least two reflective surfaces located on either side of the laser medium. The laser resonator may be designed to continuously release a laser beam from the system. Alternatively, the resonator can be designed such that when the energy oscillating in the laser medium reaches a predetermined level, it is released from the system as a high-power, short-duration laser beam.

In many systems, the laser medium is Neodymium-doped, Yttrium-Aluminum Garnet (Nd:YAG). A laser medium made from Nd:YAG absorbs optical energy most readily when the energy is at a wavelength of approximately 808 nanometers. Thus, the source to pump the Nd:YAG laser medium should be emitting light energy at approximately 808 nanometers. Semiconductor laser diodes can be manufactured with dopants that will cause the emitted light to be in a variety of wavelengths, including 808 nanometers. Thus, the semiconductor lasers, which are lasers by themselves act as the pump source for the laser medium.

The emitted light produced from the solid-state laser system is generally coherent and exits the system in a predefined area. Thus, the optical power produced can be readily focused by the use of other optical components such as lenses. The resultant emitted energy can be used for a variety of purposes including the exposure of photoactive materials, melting materials, oblating materials or even vaporizing materials.

In many uses for laser systems, it is necessary to have multiple laser outputs where each beam performs a unique function or where each beam acts in conjunction with other beams to perform one task. In prior art systems, this is accomplished by providing multiple solid-state laser systems that each produce a beam. The beams from each system are then used to perform the required task or tasks.

However, providing multiple solid-state laser systems to produce multiple laser beams has many disadvantages. For example, the space required to locate each system is large since many of the same components that operate the systems are present "X" times when "X" number of systems are used. Controlling the overall system requires extra equipment since the control electronics for each laser system is typically coupled into a master controller for the overall system. Furthermore, because many of the components in each system are redundant, there is an extra cost associated with procuring these multiply redundant components.

SUMMARY OF THE INVENTION

The present invention is a multiple-cavity, solid-state laser system for producing a plurality of output laser beams. The system typically includes a plurality of optical energy sources, a unitary solid-state laser medium, and a resonator associated with each of the plurality of optical energy sources. The system may also include a control system that allows the operator a simple means in which to selectively actuate any or all of the plurality of output laser beams.

The optical energy sources produce input optical energy for pumping the laser medium. Each optical energy source is spaced from an adjacent optical energy source by a predetermined distance so that it is incident upon the laser medium in different regions. The input optical energy from each source is generally produced along a line. In a preferred embodiment, the optical energy sources are semiconductor laser diodes each having a plurality of emitting surfaces that are arranged a line.

The laser medium has first and second side surfaces that substantially oppose each other and first and second end surfaces that also substantially oppose each other. In a typical operation, the input optical energy enters the laser medium through its first side surface and is substantially absorbed by the laser medium before reaching the first side surface after being reflected off the second side surface. Thus, a high-gain region associated with each of the plurality of optical energy sources is produced in the laser medium.

One resonator is associated with each of the optical energy sources and produces laser resonation through the laser medium. The resonator includes a pair of opposing reflective surfaces that are positioned with the laser medium therebetween. Each resonator is substantially aligned with the line of its associated one of the plurality of optical energy sources. One output laser beam exits from one of the reflective surfaces within each resonator such that multiple beams are produced from the multiple resonators located in the unitary laser gain medium.

Each resonator for the laser system is generally produced from two distinct optical components such as a highly reflective mirror and a partially reflective mirror. Alternatively, the laser system may include one large highly reflective mirror and one large partially reflective mirror. Thus, the laser resonation produced by each of the multiple high-gain regions within the laser medium would utilize resonation between the same two components, the large highly reflective and partially reflective mirrors.

The above summary of the present invention is not intended to represent each embodiment, or every aspect, of the present invention. This is the purpose of the figures and the detailed description which follow.

BRIEF DESCRIPTION OF THE DRAWINGS

Other objects and advantages of the invention will become apparent upon reading the following detailed description and upon reference to the drawings in which:

FIGS. 1A–1C are top, side, and end views of a multi-cavity, solid-state laser system of the present invention;

FIGS. 2A–2C are top, side, and end views of an alternative embodiment of the multi-cavity, solid-state laser system of the present invention;

Figure 3:
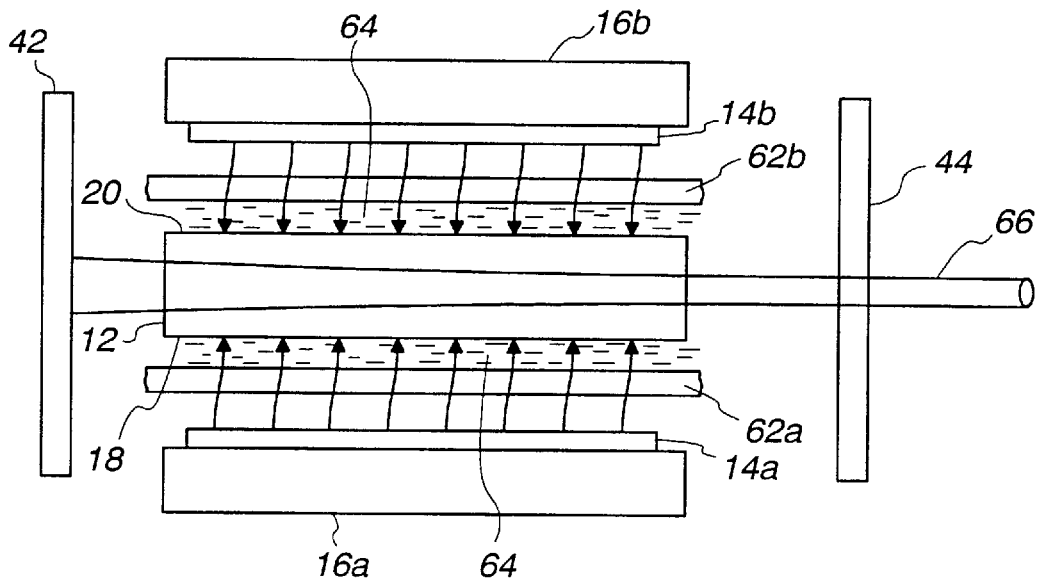
FIG. 3 is a top view of a liquid-cooled, solid-state laser system that is being pumped from two sides.

While the invention is susceptible to various modifications and alternative forms, a specific embodiment thereof has been shown by way of example in the drawings and will herein be described in detail. It should be understood, however, that it is not intended to limit the invention to the particular forms disclosed. Quite to the contrary, the intention is to cover all modifications, equivalents, and alternatives falling within the spirit and scope of the invention as defined by the appended claims.

DETAILED DESCRIPTION OF THE INVENTION

Referring now to FIGS. 1A, 1B, and 1C, a solid-state laser system 10 for producing a plurality of output beams is illustrated. FIGS. 1A and 1B are a top view and a side view, respectively, of the solid-state laser system 10. FIG. 1C is an end view showing the laser modes with the concentrated output beam located in a nearly circular shape. However, the output beam can be in a variety of shapes by changing the shape of the coatings on the optical components of the system.

The solid-state laser system 10 includes laser medium 12 which receives optical energy from an optical energy source 14, which will be referred to hereinafter as a plurality of laser diodes. The laser diodes 14 are mounted on a heat sink 16 which removes the heat produced from the operation of the laser diodes 14. Each laser diode 14 has a plurality of emitting regions that are arranged along a line such that each laser diode 14 pumps the laser medium 12 substantially along its entire length.

As can be best seen in FIG. 1A, adjacent ones of the plurality of laser diodes 14 are separated from each other by a predetermined distance PD which ultimately dictates the distance between the center lines of adjacent laser beams produced by the system 10. The predetermined distance PD and the distance that the emitting surfaces of the laser diodes 14 are removed from the laser medium 12 dictate the sizes of the high-gain regions and the distances therebetween as the amount of divergence from the laser diodes 14 depends on their distance from the laser medium 12. Typically, the predetermined distance PD is in the range of about 30% to about 300% of the thickness of the laser medium 12 measured in the direction of the pump energy.

The optical energy produced from each laser diode 14 enters the laser medium 12 at a lower surface 18. This optical energy is then absorbed by the laser medium 12. Any optical energy that is not absorbed in the laser medium 12 after entering the lower surface 18 is reflected off an upper surface 20 and is transmitted back through the laser medium 12 towards the laser diodes 14. By providing upper surface 20 with a coating which reflects the wavelength produced by the laser diodes 14, substantially all the optical energy produced by the laser diodes 14 is absorbed by the laser medium 12 after one reflection.

The amount of absorption of energy by the laser medium 12 at a given wavelength depends on various factors such as the type of dopants provided in the laser medium 12, the concentration of dopants, and the temperature at which the laser medium 12 is operated. By way of example, if the laser medium 12 is made from Neodymium (3+) doped, Yttrium-Aluminum Garnet (Nd:YAG), the peak absorption occurs at about 808 nanometers (nm) when the material is about 30° C. When the laser diodes are made of gallium arsenide with aluminum doping (AlGaAs), they emit radiation at approximately 808 nm which matches the maximum absorption spectrum for the Nd:YAG material. When an Nd:YAG laser medium absorbs energy at 808 nm, it then releases energy at a wavelength of about 1064 nm.

With regard to the source of the input energy for the laser medium 12, the laser diodes 14 can be replaced by input power systems that include lenses, concentrators, or fiber-coupled pumping sources. Put simply, as long as the input source of optical energy entering the side of the laser medium 12 produces regions of high gain along the length of the laser medium 12 which are separated by regions of low gain, the system 10 produces a plurality of laser beams. It is also possible to utilize a flash-lamp as the source as long as its output energy received by the laser medium 12 is separated, possibly by a mask, to produce separated multiple high-gain regions.

To provide for the optical resonation necessary to produce a lasing output from the system 10, energy exits the laser medium 12 through a back surface 24 and is reflected off a highly reflective (HR) mirror 30. As shown, the HR mirror 30 has a concave face such that any light which exits from back surface 24 in a diverging manner is thereby reflected back into the laser medium 12 in a converging manner toward an output surface 26 of the laser medium 12. The focal point of the concave surface is within the laser resonator to produce a stable optical system. The HR mirror 30 typically has a reflectivity value of at least about 99%.

Opposing each HR mirror 30 is a corresponding output coupling (OC) mirror 32. The OC mirror 32 is located outside the output surface 26 of the laser medium 12. The OC mirror 32 has a partially reflective coating on its surface in the shape of a circle such that a predetermined amount of energy is transmitted therethrough and released as a circular laser beam 35. The reflectivity of the OC mirror 32 determines the overall output in each laser beam 35. But, the reflectivity must be enough to produce resonation through the laser medium 12. The OC mirror 32 has a reflectivity in the range from about 5% to about 94% (i.e. about 95% to 6% is transmitted as laser beam 35) with the optimum value being dependent on the application. In a preferred embodiment, the optical shapes of both the HR mirror 30 and the OC mirror 32 are chosen and these components are coaxially aligned to establish an optically stable resonant cavity.

The laser beam 35 associated with each laser diode 14 remains operational as long as the associated laser diode 14 remains operational. In other words, the laser beams 35 have the potential to operate in a continuous wave (CW) mode.

In an alternative embodiment, each HR mirror 30 and OC mirror 30 can be bonded to the laser medium to reduce the alignment of components necessary to operate the system. Furthermore, the back surface 24 can be coated with an HR coating while the output surface 26 can be coated with a partially reflective coating. Such a configuration makes for a system which requires minimal, if any, alignment. Examples of materials used to develop these coatings are alternating layers of silicon dioxide and titanium dioxide with the reflectivity value being dependent on the relative thicknesses of the layers.

The solid-state laser system 10 can also be operated as a pulsed, or Q-switched laser system. To operate in this manner, an optical component 37 can be placed between the OC mirror 32 and the HR mirror 30 which causes increased excitation of the atoms within the laser medium 12 while no energy is released therefrom. After a predetermined amount of energy is absorbed by the optical component 37, the optical component 37 "opens" to transmit the stored energy as a high-energy, short-duration pulse that exits from the system 10. The optical component 37 can be a saturable absorbing crystal, a plastic dye, or other known components such as a $Cr^{4+}$:YAG passive Q-switch. Such a passive Q-switch could be bonded to the laser medium 12 to reduce the number of individually aligned parts. Alternatively, the HR mirror or OC mirror can be made integral with the Q-switch by coating the Q-switch with the proper reflectance. Although shown in the path of only one resonator of the laser medium 12, the optical component 37 can be placed in several or all of the resonators. In some applications, it may be advantageous to have several resonators which operate in a W manner while others operate in a Q-switched manner to produce the high-energy pulses. For example, such a modular output system is appropriate for use in applications where various types of material are to be oblated, vaporized or melted and the oblation, vaporization, and melting of these varying materials requires different output energy levels.

It should be noted that two or more individual laser diodes 14 can be grouped closely together to produce one high-gain region instead of the illustrated embodiment having only one laser diode 14 per high-gain region. Thus, the input power to each high-gain region is increased which thereby dictates a higher energy laser beam 35. It may be useful to use a lens in such a system to focus the energy from the multiple laser diodes into the desired high-gain region. It is also possible to arrange two or more laser diodes end-to-end and increase the length of the medium 12. This would create a longer resonant cavity and also increase the output power from the system 10.

By side-pumping the laser medium 12, the high-gain regions can be present along the entire length of the laser medium 12. As the laser medium 12 is often very thin (e.g. 1 mm), the amount of temperature difference between the lower surface 18 and upper surface 20 should be fairly small yielding only a small degree of thermal lensing. Even in systems where high powers are needed and the laser medium 12 is thicker, the thermal lensing can be predicted and compensated for by the OC mirror 32, the HR mirror 30, or with coatings on the surface 24 and 26. Additionally, side-pumping the laser medium 12 allows for the high-gain regions to be well defined since the input energy only travels a distance equal to two times the thickness of the laser medium 12 and, therefore, diverges only a small amount. Thus, the input power for one high-gain region does not "cross-talk" with the adjacent high-gain regions. In other words, the input pump power can be confined to one high-gain region only and will not affect the operation of adjacent laser beams. This is important if the application requires every other laser beam to operate so that no output laser beam exits from the positions therebetween. Side-pumping, as opposed to pumping the ends 24 and 26, also allows more power to be input into the laser medium 12 since it spreads the input power more evenly along the entire volume of the high-gain regions of the laser medium 12 resulting in more energy being converted into the output laser beams rather than heat. End pumping is limited by the amount of energy that can be pumped into the small end surfaces.

In FIGS. 2A–2C, another preferred embodiment of a solid-state laser system 40 is illustrated. The solid-state laser system 40 includes the basic components of the system 10 illustrated in FIGS. 1A–1C, except that now a single HR mirror 42 is located adjacent to the back surface 24 of the laser medium 12. Additionally, a single OC mirror 44 is located adjacent to the output surface 26 of the laser medium 12. In essence, the solid-state laser system 40 of FIGS. 2A–2C is different than the system 10 shown in FIGS. 1A–1C in that the solid-state laser system 40 does not utilize individual mirror components in defining each of the plurality of laser resonators within the laser medium 12.

As the pump energy from the laser diodes 14 enters the laser medium 12 through its lower surface 18, the pump energy is absorbed by the laser medium 12. Any energy that is not absorbed during the first pass through the laser medium 12 is reflected off the upper surface 20 and retransmitted through the laser medium 12 where it then has another chance to be absorbed by the laser medium 12. Again, the upper surface 20 typically includes a coating which reflects the wavelength of energy being produced by the laser diodes 14.

The energy from each laser diode 14 is focused into one region of the laser medium 12. As the energy at the pump wavelength is absorbed in each region, the laser medium 12 begins to release energy at a different wavelength which resonates in the optical cavity defined by the single HR mirror 42 and the single OC mirror 44. Each of the resonant cavities is defined not only by the single HR mirror 42 and single OC mirror 44, but it is also defined by the high-gain region HGR of the laser medium 12 due to the optical input energy caused by the pumping of the laser diode 14 associated with that resonant cavity. In other words, because the high-gain regions HGR are separated from each other by low-gain regions LGR, the resonation through the laser medium is also guided by the locations of these high-gain regions HGR such that each resonant cavity within the laser medium 12 is said to be "gain-guided."

With regard to the geometry of the laser medium 12, it has a length L (FIG. 2A), a width W (FIG. 2C), and a thickness T (FIG. 2B). As an example, a standard laser diode 14 is approximately 1 cm in length. Thus, the length L of the laser medium 12 is also about 1 cm. Each laser diode 14 is typically allocated a region of the laser medium 12 in the range from about 0.3 millimeters to about 3.0 millimeters of the width dimension W. Therefore, with a width W of about 1 cm, about thirty-two output beams can be produced. In one preferred embodiment, this value is about 1 bar/millimeter and the distance from the emitting surface of each laser diode 14 to the center of the laser medium 12 is about 0.5 mm which causes the widths of the high-gain region HGR and low-gain region LGR to be approximately the same.

The single OC mirror 44 includes a reflective coating 46 positioned within the resonant cavity and aligned with the high-gain regions HGR. The reflective coating 46 defines the resonant cavity on the single OC mirror 44 side of the cavity. The regions of the single OC mirror 44 outside the reflective coating regions 46 are low reflectivity (high transmitting) regions such that the resonant cavities are not hindered by parasitic resonations due to reflected energy off these surfaces. Also, the cavities can be operated in an unstable configuration for a small-divergence in the output laser beam 50. Alternatively, the output laser beam 50 can be limited in size by applying a high-loss coating that absorbs all energy outside the reflective coating 46 and thereby restricts the laser output beam 50.

In an alternative embodiment, the single OC mirror 44 is still present in the system but the single HR mirror 42 is replaced by a plurality of HR mirrors 42 as is shown in FIG. 1. In yet another alternative embodiment, the single HR mirror 42 exists within the system but the single OC mirror 44 is replaced by a plurality of output coupling mirrors as is shown in FIG. 1. In any case, these optical components can be either flat or curved to obtain the desired output laser beam. Consequently, a solid-state laser system producing a plurality of laser output beams can be designed where the resonant cavities are optically stable, marginally stable, or unstable, depending upon the characteristic output which is desired.

In a further alternative embodiment, the HR mirror 42 could be replaced by a second OC mirror having only a partial reflectivity. Depending on the value of the partial reflectivities, a laser beam could exit in both directions. Thus, the task being performed by output laser beams 50 could be performed on both sides of the laser system 10 due to this second set of output laser beams.

FIG. 2B also illustrates one way in which to mount the laser medium 12. The upper surface 20 of the laser medium 12 is bonded to a heat sink 52 which removes any excess heat from the laser medium 12. The bonding layer 54 can be of a variety of materials including thermally conductive epoxies and adhesives. Thus, any isotherms in the laser medium 12 will run generally parallel to its length.

The heat sink 52 and bonding layer 54 can also be made of a material that is transparent to the pump light produced from the laser diodes 14. As an example, the heat sink could be made of undoped YAG material which would transmit the pump energy. This is beneficial in that the side of the laser medium 12 which is being cooled through thermal conduction could also be pumped with energy from the diodes 14. It should be noted that the bonding layer 54 and the heat sink 52 are not illustrated in FIGS. 2A and 2C for the sake of clarity.

FIG. 3 illustrates in a side view only a solid-state laser system 60 which includes the single HR mirror 42 and the single OC mirror 44. However, the solid-state laser system 60 includes two sets of laser diode arrays 14a and 14b which pump the laser medium 12 from both the top and the bottom. Each laser diode in array 14a is aligned with a corresponding laser diode in array 14b. Each array 14a and 14b is mounted on its own heat sink 16a and 16b, respectively. Thus, the high-gain regions in the laser medium 12 are defined by the pump energy from laser diodes 14a located below the laser medium 12 and laser diodes 14b located above the laser medium 12.

Additionally, FIG. 3 includes two pieces of glass 62a and 62b that are located between the laser diodes 14a and 14b and the laser medium 12. These pieces of glass 62a and 62b are optically transparent to the pump energy wavelength produced by the laser diodes 14a and 14b. The pieces of glass 62a and 62b define between each of them and the laser gain medium 12 a small region 64 through which a liquid coolant flows to cool the laser medium 12. The coolant can be a variety of liquids which are transparent to the wavelength being emitted from the laser diode arrays 14a and 14b, including water. Due to the fact that the laser gain medium 12 is pumped on both sides and has a liquid-based temperature control system, the solid-state laser system 60 can operate at higher powers such that laser beams 66 contain more power than those output laser beams illustrated in FIGS. 1 and 2.

Figure 4:
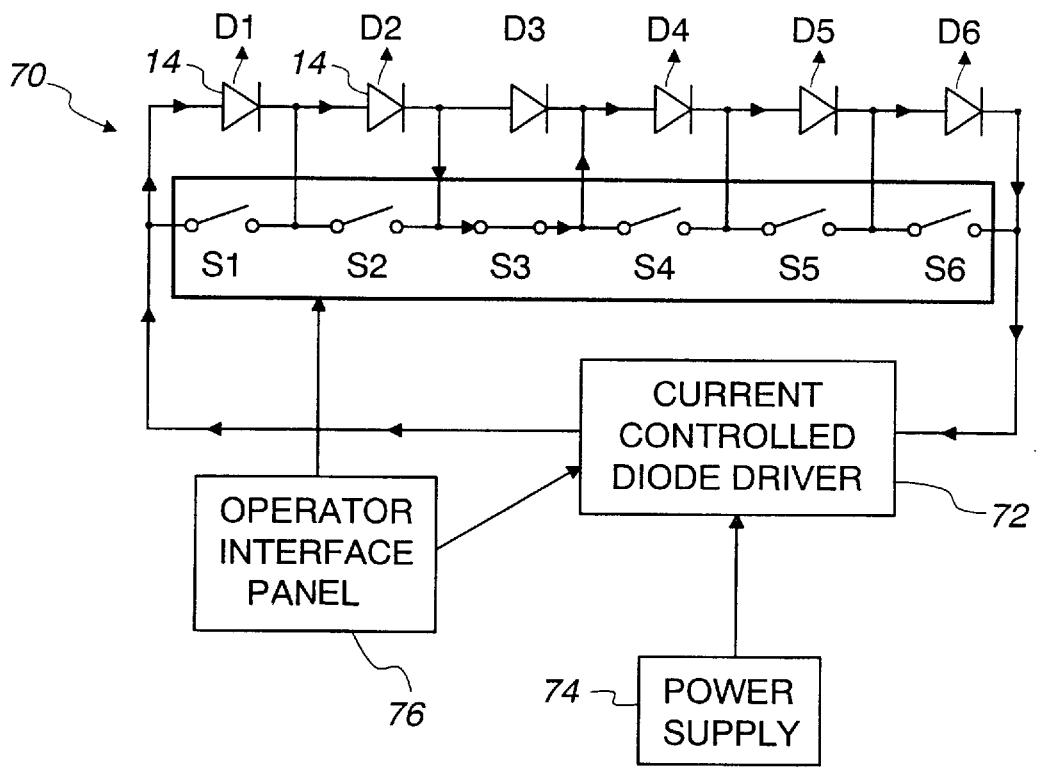
FIG. 4 is a schematic of the control circuitry that is used to operate the solid-state laser system of the present invention.

FIG. 4 illustrates a control system 70 which allows any of the previously discussed solid-state laser systems to be operated as an addressable laser system. In other words, each of the laser diodes 14 can be independently controlled thereby controlling its associated laser output beam.

In the control system 70, each of the laser diodes 14, which are designated in FIG. 4 as D1–D6, has an associated switch S1–S6. Because of the inherent resistance in each of the diodes D1–D6, if a switch is closed, such as switch S3 in FIG. 4, the current which normally passes through the diode D3 is shunted around the diode D3 (i.e. shorts the laser diode D3) and passes through switch S3 as the current travels through the least resistive path. No optical energy is then produced in diode D3 due to the fact that switch S3 has been closed. Thus, by closing any switch, the associated laser diode 14 will not produce optical energy and, therefore, the laser output beam associated with that laser diode 14 is non-existent.

The control system 70 includes a current controlled diode driver 72 which receives its input power from a power supply 74. The diode driver 72 is controlled by the operator through an operator interface panel 76. The operator interface panel 76 also controls the actuation of the switches S1–S6. The result of the use of control system 70 is that the operator can dictate which laser beams are to exit from the solid-state laser system by instructing the operator control panel 76 of this desire. Preferably, the operator interface panel 76 has the ability to receive data from an external source instructing it to generate one or more of the output laser beams in a time-dependent fashion.

Alternatively, each diode D1–D6 may have its own driver thereby eliminating the diode driver 72 and the series of switches S1–S6. Depending on the inputs from the operator interface panel 76, each diode driver would activate its associated laser diode to produce the output laser beam. Each diode driver could pull energy from the same power supply. Such a control system may be useful in systems where some output beams are pulsed while others are to be operated in a CW manner.

Figure 5A:
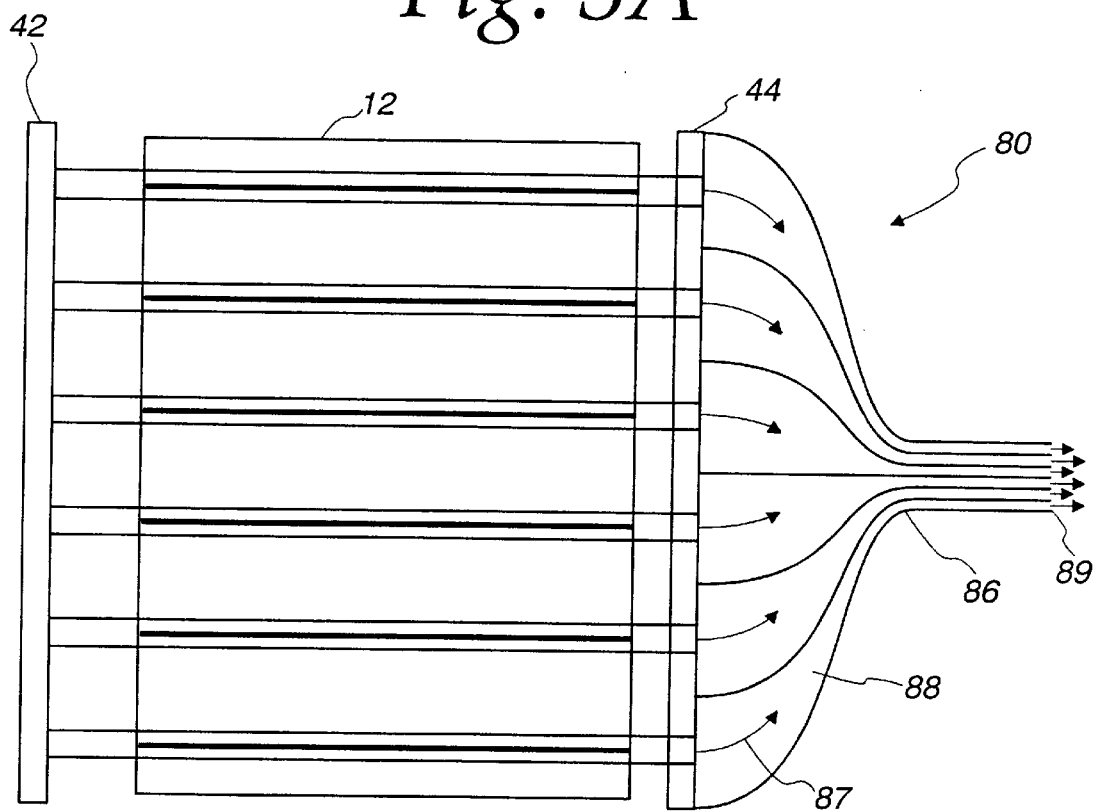
FIGS. 5A and 5B are top and side views of a multi-cavity, solid-state laser system in which the input power is provided through additional optical components and the output beams are delivered through a fiber-optic coupler.
Figure 5B:
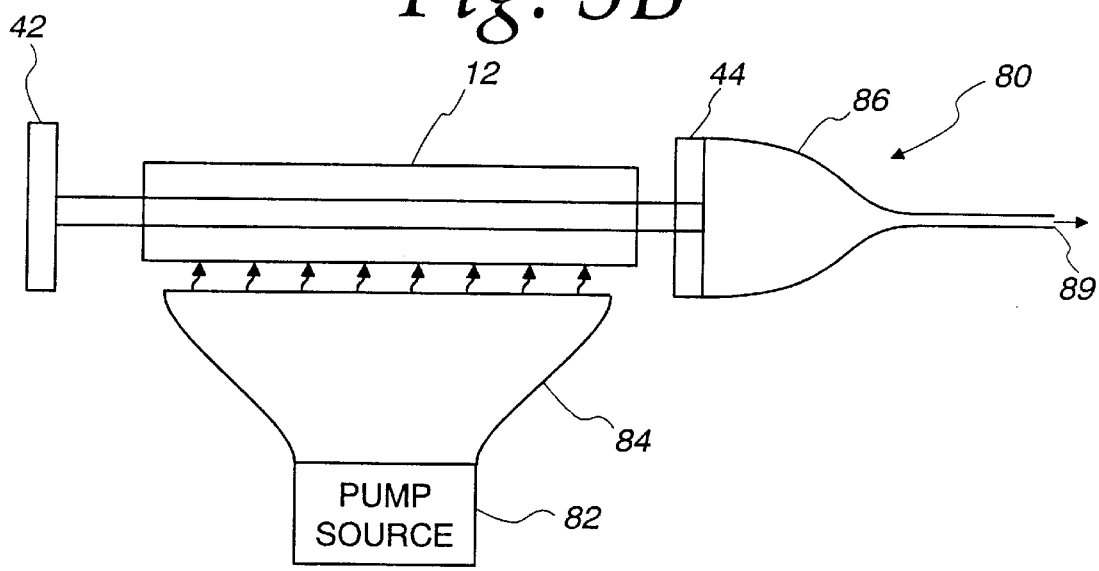

FIGS. 5A and 5B illustrate in a top view and side view, respectively, yet another alternative solid-state laser system 80. In the laser system 80, the laser medium 12 is pumped with energy by an energy pump source 82. The pump source 82, which is illustrated only schematically, can be located more remotely from the laser medium 12 than the laser diodes 14 described in FIGS. 1–3. To bring the pump energy to the laser medium 12, an optical component 84 is schematically illustrated. This optical component 84 may be a lens system or possibly a fiber-optic coupler. In any event, the optical component 84 receives the energy from the pump source 82 and distributes the energy to the laser medium 12. The overall distribution within the laser medium 12 is the same as has been previously described in that it creates high-gain regions that are separated by low-gain regions.

Attached or adjacent to the OC mirror 44 is a fiber-optic coupler 86. The fiber-optic coupler 86 receives the output laser beams 87 from the solid-state laser system 80 and transports them in individual optic guides 88 to an output end 89 of the fiber-optic coupler 86. As shown, the six beams are arranged in horizontal plane as the exit from the output end 89. Alternatively, the beams may be stacked in several rows of several columns which, in this case, could be two rows of three columns.

Consistent with the fact that the pump source 82 is only shown schematically, the input energy can be from a variety of sources. For example, the input power can be from semiconductor laser diodes, other solid-state lasers or a common flash-lamp.

Each of these embodiments and obvious variations thereof is contemplated as falling within the spirit and scope of the invention, which is set forth in the following claims.

What is claimed is:

1. A multi-cavity, solid-state laser system for producing a plurality of output laser beams, comprising:

a plurality of optical energy sources each producing input optical energy, each of said plurality of optical energy sources being spaced from an adjacent one of said plurality of optical energy sources by a predetermined distance and producing said input optical energy substantially along a line;

a solid-state laser medium receiving said input optical energy, said laser medium having first and second side surfaces substantially opposing each other and first and second end surfaces substantially opposing each other, said input optical energy entering said laser medium through said first side surface and being substantially absorbed in said laser medium, said predetermined distance between adjacent ones of said plurality of optical energy sources causing individual high-gain regions in said laser medium, each of said high-gain regions being associated with a corresponding one of said plurality of optical energy sources; and resonating means associated with each of said plurality of optical energy sources for producing laser resonation through said first and second end surfaces of said laser medium in said respective high-gain region, said resonating means including a pair of opposing reflective surfaces positioned with said laser medium therebetween, each of said resonating means being substantially aligned with said line of said associated one of said plurality of optical energy sources and producing one of said plurality of output laser beams.

2. The multi-cavity, solid-state laser system of claim 1, wherein said resonating means associated with each of said plurality of optical energy sources are located on first and second unitary mirrors that provide said reflective surfaces, a center point of said pair of reflective surfaces associated with one of said plurality of optical energy sources being separated from a center point of an adjacent pair of reflective surfaces on said first and second unitary mirrors by approximately said predetermined distance.

3. The multi-cavity, solid-state laser system of claim 2, wherein said first mirror is a highly reflective mirror and said second mirror is an output coupler mirror.

4. The multi-cavity, solid-state laser system of claim 3, wherein said output coupler mirror has a partially reflective region associated with each of said plurality of optical energy sources, said partially reflective regions being substantially aligned with said high-gain region and transmitting one of said plurality of output laser beams.

5. The multi-cavity, solid-state laser system of claim 1, wherein said lines associated with said plurality of optical energy sources are substantially parallel.

6. The multi-cavity, solid-state laser system of claim 1, wherein each of said high-gain regions has a first width measured perpendicular to a corresponding one of said lines and is separated from an adjacent high-gain region by a low-gain region having a second width, said first width being approximately the same as said second width.

7. The multi-cavity, solid-state laser system of claim 1, wherein at least one of said first and second side surfaces of said laser medium is cooled with a flowing liquid.

8. The multi-cavity, solid-state laser system of claim 1, wherein said pair of reflective surfaces are provided by coatings on said first and second end surfaces of said laser medium, one of said coatings being a highly reflective coating and the other of said coatings being a partially reflective coating thereby transmitting said plurality of laser beams.

9. The multi-cavity, solid-state laser system of claim 1, further including a second plurality of optical energy sources producing additional input optical energy, each of said second plurality of optical energy sources being spaced from an adjacent one of said second plurality of optical energy sources by substantially said predetermined distance and producing said additional input optical energy substantially along a second line, said additional input optical energy entering said laser medium through said second side surface.

10. The multi-cavity, solid-state laser system of claim 1, wherein one of said pair of reflective surfaces is a highly reflective mirror, said highly reflective mirror being concave.

11. The multi-cavity, solid-state laser system of claim 1, further including optical elements for guiding said optical input energy from said plurality of optical energy sources to said laser medium to accurately define said high-gain regions within said laser medium.

12. The multi-cavity, solid-state laser system of claim 11, wherein said optical elements include a lens.

13. The multi-cavity, solid-state laser system of claim 11, wherein said optical elements include fibers for transmitting optical energy.

14. The multi-cavity, solid-state laser system of claim 1, wherein said plurality of optical energy sources are semiconductor laser diodes.

15. The multi-cavity, solid-state laser system of claim 14, wherein each of said semiconductor laser diodes has a plurality of emitting regions defining said line.

16. The multi-cavity, solid-state laser system of claim 1, wherein at least one of said resonating means includes an optical component for making said associated output laser beam a high-power, short-duration energy pulse.

17. The multi-cavity, solid-state laser system of claim 16, wherein said optical component is a passive Q-switch.

18. The multi-cavity, solid-state laser system of claim 1, wherein said second surface has a coating for reflecting said input optical energy to retransmit said input optical energy back through said laser medium for further absorption.

19. The multi-cavity, solid-state laser system of claim 1, where in said plurality of optical energy sources includes at least two arrays of semiconductor laser diodes, said arrays being arranged end-to-end so that one laser diode from each of said arrays is positioned along a corresponding one of said lines.

20. The multi-cavity, solid-state laser apparatus of claim 1, wherein said predetermined distances between said plurality of optical energy sources are constant.

21. The multi-cavity, solid-state laser apparatus of claim 1, wherein said optical energy sources are spaced away from said solid-state laser medium.

22. The multi-cavity, solid-state laser system of claim 1, wherein each of said plurality of optical energy sources is capable of being selectively powered.

23. A multi-cavity, solid-state laser system for producing a plurality of output laser beams, comprising:

a solid-state laser medium having a length, a width, and a thickness, said length and said width being greater than said thickness;

a plurality of optical energy sources producing input optical energy for pumping said solid-state laser medium, each of said plurality of optical energy sources being spaced from an adjacent one of said plurality of optical energy sources by a predetermined distance in the direction of said width of said laser medium, each of said plurality of optical energy sources producing said input optical energy substantially along a line extending generally along said length of said laser medium, said input optical energy entering said laser medium in a direction generally perpendicular to surfaces of said laser medium defining said thickness, said predetermined distance between adjacent ones of said plurality of optical energy sources selected to be a value producing a plurality of distinct high-gain regions in said laser medium; and resonating means associated with each of said plurality of optical energy sources for producing laser resonation through said laser medium, said resonating means including a pair of opposing reflective surfaces positioned with said laser medium therebetween, each of said resonating means being substantially aligned with said line for the associated one of said plurality of optical energy sources and producing one of said plurality of output laser beams, center lines of adjacent ones of said plurality of output laser beams being separated by approximately said predetermined distance.

24. The multi-cavity, solid-state laser system of claim 23, wherein said resonating means associated with each of said plurality of optical energy sources are located on first and second unitary mirrors that provide said reflective surfaces, a center point of said pair of reflective surfaces associated with one of said plurality of optical energy sources being separated from a center point of an adjacent pair of reflective surfaces on said first and second unitary mirrors by approximately said predetermined distance.

25. The multi-cavity, solid-state laser system of claim 23, wherein said predetermined distance is approximately in the range of 30% to 300% of said thickness of said laser medium.

26. The multi-cavity, solid-state laser system of claim 23, wherein said pair of reflective surfaces are provided by coatings on said first and second end surfaces of said laser medium, one of said coatings being a highly reflective coating and the other of said coatings being a partially reflective coating thereby transmitting said plurality of laser beams.

27. The multi-cavity, solid-state laser system of claim 23, wherein said length and said width of said laser medium are approximately 1 centimeter and said thickness is approximately 0.1 centimeters.

28. The multi-cavity, solid-state laser apparatus of claim 23, wherein the number of said plurality of optical energy sources is a value "X", said width divided by said value "X" is in the range of a 0.3 millimeter/laser source and 3.0 millimeter/laser source.

29. The multi-cavity, solid-state laser system of claim 23, wherein said plurality of optical energy sources are semiconductor laser diodes.

30. The multi-cavity, solid-state laser system of claim 29, wherein each semiconductor laser diode has a plurality of emitting regions defining said line.

31. The multi-cavity, solid-state laser system of claim 23, wherein each of said plurality of distinct high-gain regions is produced by at least two laser diodes.

32. The multi-cavity, solid-state laser system of claim 23, wherein said length is greater than said width.

33. The multi-cavity, solid-state laser apparatus of claim 23, wherein said predetermined distances between said plurality of optical energy sources are constant.

34. The multi-cavity, solid-state laser apparatus of claim 23, wherein said optical energy sources are spaced away from said solid-state laser medium.

35. The multi-cavity, solid state laser system of claim 23, wherein each of said plurality of optical energy sources is capable of being selectively powered.

36. A multi-cavity, solid-state laser system for producing a plurality of output laser beams, comprising:

an optical energy source producing a plurality of distinct regions of input optical energy, each of said plurality of distinct regions being spaced from an adjacent distinct region by a predefined distance;

a solid-state laser medium receiving said input optical energy from said distinct regions, said solid-state laser medium having multiple high-gain regions, each high-gain region being associated with a corresponding one of said distinct regions of input optical energy, each of said high-gain regions separated from an adjacent high-gain said region by substantially said predefined distance, said laser medium having first and second side surfaces substantially opposing each other, said input optical energy entering said laser medium through said first side surface and being substantially absorbed by said laser medium; and resonating means associated with each of said distinct regions of input optical energy for producing laser resonation through said laser medium, said resonating means including a pair of opposing reflective surfaces positioned with said laser medium therebetween, each of said resonating means producing an output laser beam associated with each of said distinct regions of input optical energy, said output laser beams being in a direction that is transverse to said input optical energy and generally parallel to said first and second side surfaces.

37. The multi-cavity, solid-state laser system of claim 36, wherein said optical energy source is a plurality of semiconductor laser diodes each having a plurality of emitting regions along said line.

38. The multi-cavity, solid-state laser system of claim 37, wherein one of said plurality of semiconductor laser diodes produces energy that is allocated to only one of said distinct regions.

39. The multi-cavity, solid-state laser system of claim 36, wherein said resonating means associated with each of said plurality of optical energy sources are located on first and second unitary mirrors that provide said reflective surfaces.

40. The multi-cavity, solid-state laser system of claim 36, wherein said pair of reflective surfaces a re provided by coatings on said first and second end surfaces of said laser medium, one of said coatings being a highly reflective coating and the other of said coatings being a partially reflective coating thereby transmitting said plurality of laser beams.

41. The multi-cavity, solid-state laser system of claim 36, wherein at least one of said resonating means includes an optical component for making said associated output laser beam a high-power, short-duration energy pulse.

42. The multi-cavity, solid-state laser system of claim 41, wherein said optical component is a passive Q-switch.

43. The multi-cavity, solid-state laser system of claim 36, wherein said second surface has a coating that reflects said input optical energy to retransmit said input optical energy back through said laser medium for further absorption.

44. The multi-cavity, solid-state laser system of claim 36, wherein said optical energy source is capable of being selectively powered to produce said plurality of distinct regions.

45. An addressable multi-cavity, solid-state laser system for producing a plurality of out put laser beams, comprising:

a plurality of optical energy sources producing input optical energy, each of said plurality of optical energy sources being in a spatial arrangement with the remaining ones of said plurality of optical energy sources;

a unitary solid-state laser medium receiving said input optical energy from said plurality of optical energy sources, said solid-state laser medium having multiple individual high-gain regions brought about by said spatial arrangement of said plurality of optical energy sources, said laser medium having first and second side surfaces substantially opposing each other, said input optical energy entering said laser medium through said first side surface and being substantially absorbed by said laser medium;

resonating means associated with each of said plurality of optical energy sources for producing laser resonation through said laser medium in said high-gain regions, said resonating means including a pair of opposing reflective surfaces positioned with said laser medium therebetween, each of said resonating means producing one of said plurality of output laser beams;

means for supplying electrical power to said plurality of optical energy sources; and means for controlling said electrical power delivered from said electrical supply means to selected ones of said plurality of optical energy sources to selectively actuate ones of said output laser beams associated with said selected ones of said plurality of optical energy sources.

46. The addressable multi-cavity, solid-state laser system of claim 45, wherein said controlling means includes at least a switch.

47. The addressable multi-cavity, solid-state laser system of claim 45, wherein said plurality of optical energy sources are semiconductor laser diodes and said electrical driver provides said electrical power to said plurality of semiconductor laser diodes in series.

48. The addressable multi-cavity, solid-state laser system of claim 47, wherein controlling means includes a switch associated with each of said plurality of semiconductor laser diodes, a closed state of said switch prohibits current from entering said associated semiconductor laser diode.

49. The addressable multi-cavity, solid-state laser system of claim 45, further including an operator interface panel to choose said selected ones of said plurality of optical energy sources from which said output laser beams are desired.

50. The addressable multi-cavity, solid-state laser system of claim 45, wherein at least one of said resonating means includes an optical component for making said associated output laser beam a high-power, short-duration energy pulse.

51. The addressable multi-cavity, solid-state laser system of claim 50, wherein said optical component is a passive Q-switch.

52. The addressable multi-cavity, solid-state laser system of claim 45, wherein said electrical supply means includes an electrical driver for each of said optical energy sources.

53. A method of producing multiple laser beams from a unitary piece of solid-state laser medium, comprising the steps of:

pumping said solid-state laser medium with optical energy in distinct pumping regions of said laser medium, said optical energy entering said laser medium in a direction that is generally transverse to the length of said laser medium and producing multiple high-gain regions, each of said high-gain regions being associated with a corresponding one of said distinct pumping regions, said multiple high-gain regions being separated from each other;

placing a reflective surface on both sides of said laser medium adjacent to each of said high-gain regions;

oscillating energy produced in each of said multiple high-gain regions between said reflective surfaces associated each of said multiple high-gain regions; and releasing said oscillating output energy through said reflective surfaces to produce said multiple laser beams.

54. The method of claim 53, wherein said one of said reflective surfaces for each high-gain region is a partially reflective mirror, said step of releasing said output energy is accomplished by said oscillating energy becoming incident upon and transmitting through said partially reflective mirror.

55. The method of claim 53, wherein said step of releasing said oscillating energy is accomplished through the steps of building up said oscillating energy in said high-gain regions and releasing said oscillating energy in a short duration to produce a high-energy, short-duration laser beam.

56. The method of claim 53, wherein said step of pumping said solid-state laser medium includes the step of selectively pumping specific ones of said distinct pumping regions.

57. A multi-cavity, solid-state laser system for producing a plurality of output laser beams, comprising:

a plurality of optical energy sources having a spatial arrangement for producing optical energy at discrete regions, each of said discrete regions of said optical energy being spaced from adjacent ones of said discrete regions;

a solid-state laser medium having a pair of side surfaces defining a thickness, said laser medium being positioned with respect to said plurality of optical energy sources to receive said input optical energy in a direction generally perpendicular to said side surfaces defining said thickness, said laser medium having multiple high-gain regions, said multiple high-gain regions resulting from said spatial arrangement of said plurality of said optical energy sources; and resonating means associated with each of said plurality of optical energy sources for producing laser resonation through said laser medium in said respective high-gain region, each of said resonating means producing one of said plurality of output laser beams.

* * * * *

UNITED STATES PATENT AND TRADEMARK OFFICE
CERTIFICATE OF CORRECTION

PATENT NO : 6,061,378
DATED : May 9, 2000
INVENTOR(S) : Marshall, et al.

It is certified that error appears in the above-identified patent and that said Letters Patent are hereby corrected as shown below:

Column 5, line 12  There should be a new paragraph before the word --Although--

Column 5, line 16  Replace "a W manner" With --a CW manner--

Column 12, line 13  Replace "gain said region" With --gain region--

Column 12, line 42  Replace "a re" With --are--

Please amend the cover page of the patent as follows:

[56] References Cited: U.S. PATENT DOCUMENTS: Please add
5,257,277 ... 10/93 ... Yagi, et al.
5,570,387 ... 10/96 ... Carriere, et al.
5,590,147 ... 12/96 ... Hobbs, et al.

Signed and Sealed this

Eighth Day of May, 2001

*Attest:*

NICHOLAS P. GODICI

*Attesting Officer*   *Acting Director of the United States Patent and Trademark Office*